(12) United States Patent
Fukushima

(10) Patent No.: US 9,975,488 B2
(45) Date of Patent: May 22, 2018

(54) PARKING ASSISTANCE DEVICE AND PARKING ASSISTANCE METHOD

(71) Applicant: Nissan Motor Co., Ltd., Yokohama-Shi, Kanagawa (JP)

(72) Inventor: Yoshitake Fukushima, Kanagawa (JP)

(73) Assignee: Nissan Motor Co., Ltd., Yokohama-shi, Kanagawa (JP)

( * ) Notice: Subject to any disclaimer, the term of this patent is extended or adjusted under 35 U.S.C. 154(b) by 181 days.

(21) Appl. No.: 15/114,313

(22) PCT Filed: Jan. 30, 2014

(86) PCT No.: PCT/JP2014/052107
§ 371 (c)(1),
(2) Date: Jul. 26, 2016

(87) PCT Pub. No.: WO2015/114775
PCT Pub. Date: Aug. 6, 2015

(65) Prior Publication Data
US 2017/0001563 A1      Jan. 5, 2017

(51) Int. Cl.
*B60R 1/00* (2006.01)
*H02J 50/00* (2016.01)
(Continued)

(52) U.S. Cl.
CPC .................... *B60R 1/00* (2013.01);
*B60L 3/00* (2013.01); *B60L 11/18* (2013.01);
*B60L 11/182* (2013.01);
(Continued)

(58) Field of Classification Search
None
See application file for complete search history.

(56) References Cited

U.S. PATENT DOCUMENTS

2013/0024059 A1 * 1/2013 Miller ................... H02J 50/12
701/22
2016/0159234 A1 * 6/2016 Lewis ...................... B60R 1/00
701/22

FOREIGN PATENT DOCUMENTS

CN          202923500 U     5/2013
EP           1930203 A1     6/2008
(Continued)

OTHER PUBLICATIONS

Chinomi, S. et al., Optimization of All-around View Image Quality and Camera Calibration Method, SAE Int. J. Passeng. Cars-Electron. Electr. Syst., 2009, 1(1):269-274.

*Primary Examiner* — Michael J Hess
(74) *Attorney, Agent, or Firm* — Young Basile Hanlon & MacFarlane, P.C.

(57) ABSTRACT

A parking assistance device includes: imaging means mounted on a vehicle to image a periphery of the vehicle; a coil for a vehicle installed on a bottom surface of the vehicle; a displaying means that displays an image; and a controlling means that performs a display control on the displaying means. The controlling means stores a parking initial image, simultaneously showing a power transmission coil installed on a road surface in a parking space and ground marks provided at a predetermined distance from the power transmission coil, displays the power transmission coil on the displaying means with reference to the ground marks imaged by the imaging means and the parking initial image when a distance between the vehicle and a target parking position falls below a predetermined value, and superposes and displays an image indicating the coil for a vehicle on the displaying means.

3 Claims, 11 Drawing Sheets

(51) Int. Cl.
   *H02J 50/90* (2016.01)
   *B60L 3/00* (2006.01)
   *B60L 11/18* (2006.01)
   *G01R 31/00* (2006.01)
   *B62D 15/02* (2006.01)
   *G06K 9/00* (2006.01)
   *G06T 7/70* (2017.01)

(52) U.S. Cl.
   CPC ....... *B60L 11/1829* (2013.01); *B60L 11/1833* (2013.01); *B60L 11/1835* (2013.01); *B60L 11/1838* (2013.01); *B62D 15/027* (2013.01); *G01R 31/00* (2013.01); *G06K 9/00798* (2013.01); *G06K 9/00812* (2013.01); *G06T 7/70* (2017.01); *H02J 50/00* (2016.02); *H02J 50/90* (2016.02); *B60L 11/1809* (2013.01); *B60L 2230/10* (2013.01); *B60L 2250/16* (2013.01); *B60R 2300/308* (2013.01); *B60R 2300/806* (2013.01); *Y02T 10/7005* (2013.01); *Y02T 10/7088* (2013.01); *Y02T 90/121* (2013.01); *Y02T 90/122* (2013.01); *Y02T 90/125* (2013.01); *Y02T 90/128* (2013.01); *Y02T 90/14* (2013.01); *Y02T 90/163* (2013.01)

(56) References Cited

FOREIGN PATENT DOCUMENTS

| | | |
|---|---|---|
| FR | 2981626 A1 | 4/2013 |
| JP | 2010028432 A | 2/2010 |
| JP | 2010226945 A | 10/2010 |
| JP | 2010234878 A | 10/2010 |
| JP | 2011015549 A | 1/2011 |
| JP | 2012175764 A | 9/2012 |
| JP | 2013236524 A | 11/2013 |
| JP | 5751383 B2 | 7/2015 |
| WO | 2013146139 A1 | 10/2013 |

* cited by examiner

SCREEN-SWITCH TRIGGER LINE

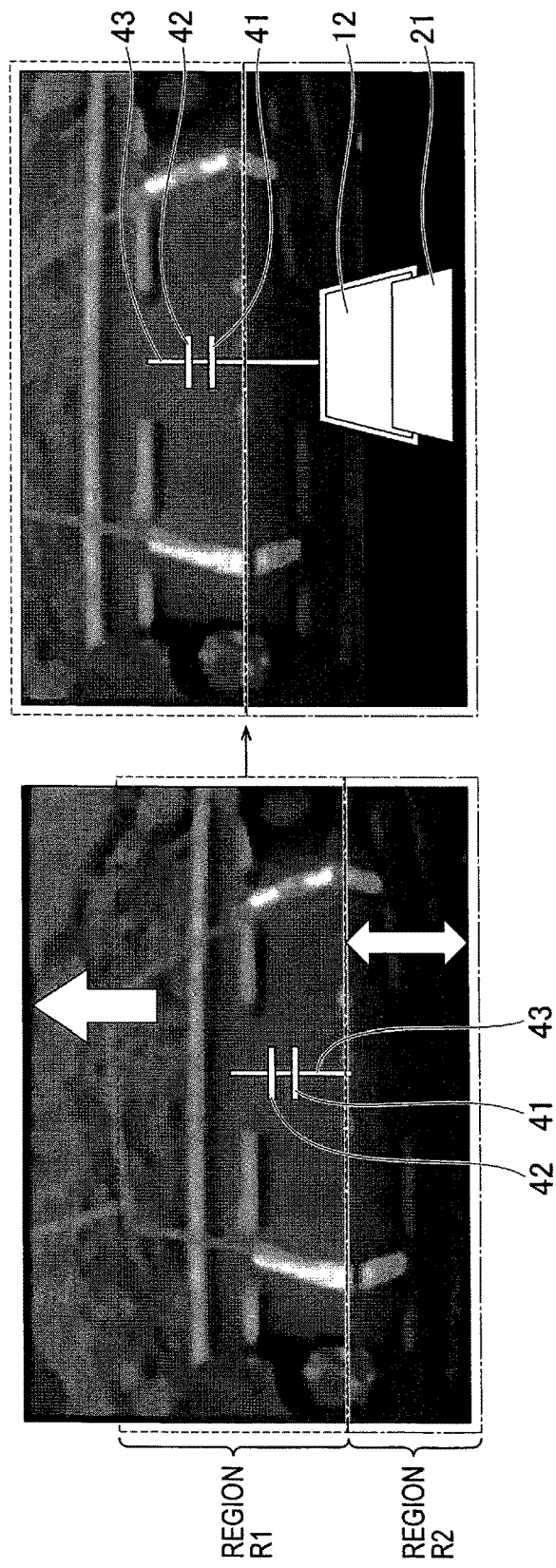

PARKING ASSISTANCE DEVICE AND PARKING ASSISTANCE METHOD

TECHNICAL FIELD

The present invention relates to a parking assistance device and a parking assistance method.

BACKGROUND

Wireless charging systems have been developed that charge batteries installed in vehicles such as electric vehicles and hybrid vehicles via a wireless connection without the use of plugs. Accurate positioning of power receiving devices on the vehicle side and power transmission devices on the ground side is important to implement efficient charging in such wireless charging systems. Japanese Patent Application No. 2011-015549 describes a positioning assistance system that uses weak excitation to determine a distance between a power receiving device on the vehicle side and a power transmission device on the ground side and displays the result thus obtained.

The system described in Japanese Patent Application Publication No. 2011-015549 displays the power receiving device on the vehicle side and the power transmission device on the ground side as virtual images. This may prevent a driver from instinctively figuring out which direction the vehicle should be moved, even when the distance between the devices is determined.

SUMMARY

In view of the foregoing, an object of the present invention is to provide a parking assistance device that assists a driver in immediately understanding a positional relationship between a power receiving device on the vehicle side and a power transmission device on the ground side so as to implement the positioning therebetween with high accuracy.

A parking assistance device according to an aspect of the present invention is configured to image a parking initial image simultaneously showing a power transmission coil installed on a road surface in a parking space and a ground mark provided at a predetermined distance from the power transmission coil, and display the power transmission coil with reference to the ground mark imaged and the parking initial image when a distance between a vehicle and a target parking position falls below a predetermined value, and superposing and displaying an image indicating a coil for a vehicle installed on a bottom surface of the vehicle.

BRIEF DESCRIPTION OF DRAWINGS

FIG. 6(a) is an image displayed on a display unit before screen switching;

FIG. 6(b) is an image displayed on the display unit after screen switching;

DETAILED DESCRIPTION OF THE EMBODIMENTS

Figure 1:
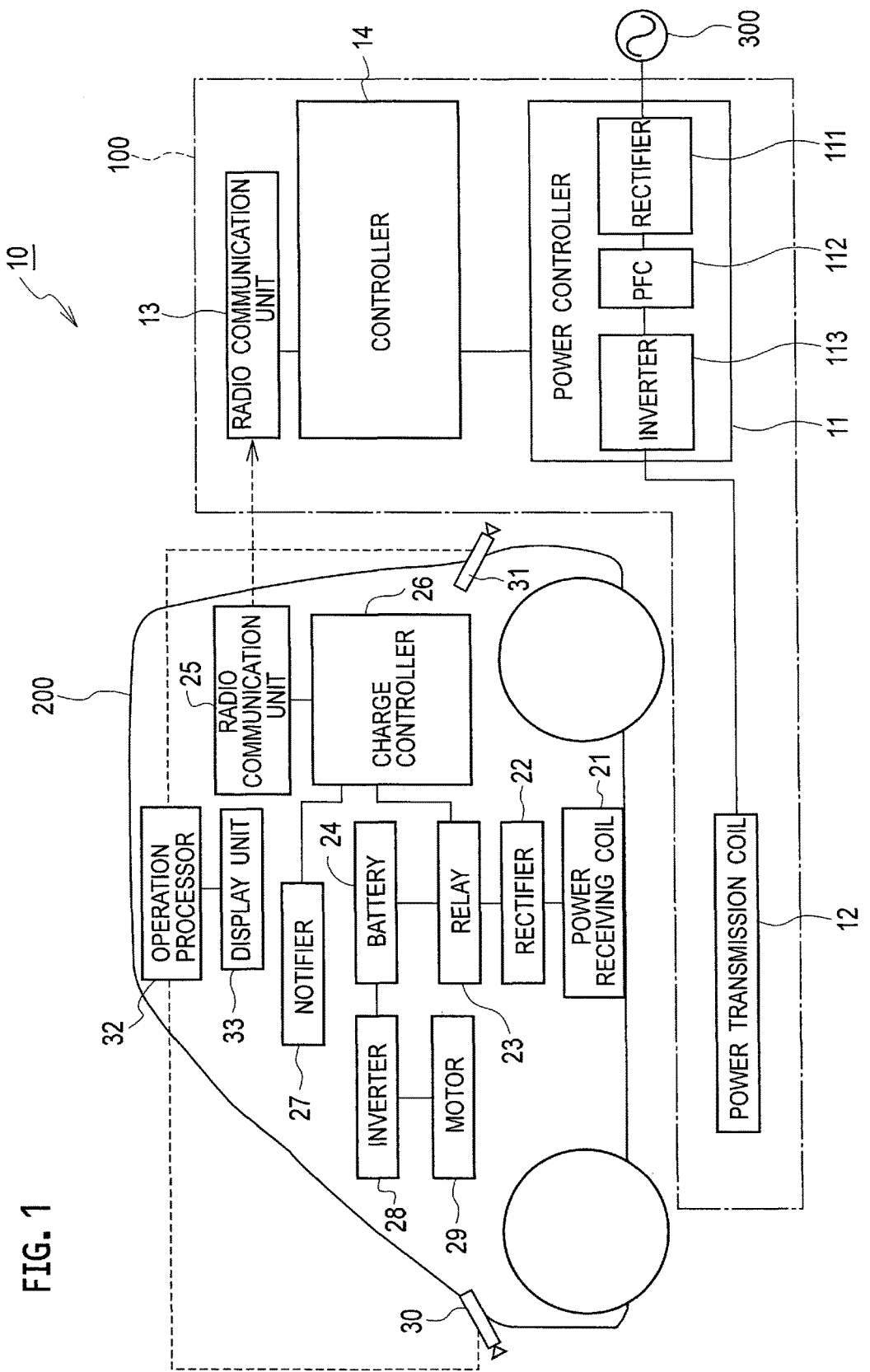
FIG. 1 is a configuration diagram showing an entire wireless charging system including a vehicle equipped with a parking assistance device according to an embodiment of the present invention and a power supply device.

Hereinafter, an embodiment of the present invention will be described with reference to the drawings. FIG. 1 is a configuration diagram showing an entire wireless charging system 10 including a vehicle 200 equipped with a parking assistance device according to the embodiment of the present invention and a power supply device 100.

As shown in FIG. 1, the wireless charging system 10 includes the power supply device 100 placed in, for example, a power supply stand or a parking lot, and the vehicle 200, and supplies electric power via a wireless connection from a power transmission coil 12 installed in the power supply device 100 to a power receiving coil 21 provided on the vehicle side. More particularly, the wireless charging system 10 conducts transmission and reception of high-frequency electric power between the power transmission coil 12 and the power receiving coil 21 in a wireless manner through electromagnetic induction. Once a voltage is applied to the power transmission coil 12, a magnetic connection is caused between the power transmission coil 12 and the power receiving coil 21, so as to supply electric power from the power transmission coil 12 to the power receiving coil 21.

The power supply device 100 includes a power controller 11, the power transmission coil 12, a radio communication unit 13, and a controller 14. The power controller 11 includes a rectifier 111, a power factor correction (PFC) circuit 112, and an inverter 113. The power controller 11 converts AC power transmitted from an AC power source 300 into high-frequency AC power and transmits the converted power to the power transmission coil 12.

The rectifier 111 is electrically connected to the AC power source 300 to rectify the AC power output from the AC power source 300. The PFC circuit 112 is connected between the rectifier 111 and the inverter 113 to implement power factor correction by rectifying waveforms output from the rectifier 111.

The inverter 113 is a power conversion circuit including a PWM control circuit having a switching device such as an IGBT. In particular, the inverter 113 switches ON/OFF states of the switching device according to a detection current detected by a current sensor (not shown), and converts power from the PFC circuit 112 into high-frequency AC power to supply the converted power to the power transmission coil 12.

The radio communication unit 13 communicates with a radio communication unit 25 installed in the vehicle 200. The controller 14 controls the entire power supply device 100 to transmit a signal for starting power supply from the wireless power supply device 100 toward the vehicle 200 through the communication between the radio communication units 13 and 25 or receive, from the vehicle 200 side, a request signal for requesting electric power supplied from the wireless power supply device 100. The controller 14 also controls the switching operation of the inverter 113 according to the detection current detected by the current sensor (not shown), so as to regulate the electric power supplied to the power transmission coil 12.

The vehicle 200 includes the power receiving coil 21, a rectifier 22, a relay 23, a battery 24, the radio communication unit 25, a charge controller 26, a notifier 27, an inverter 28, a motor 29, a front camera 30, a rear camera 31, an operation processor 32, and a display unit 33.

The power receiving coil 21 is a coil for a vehicle placed on the bottom of the vehicle 200. When the vehicle 200 is parked in a predetermined parking position, the power receiving coil 21 is positioned to face the power transmission coil 12 at a predetermined distance. When electric power for supply is supplied to the power transmission coil 12, the electric power is transmitted to the power receiving coil 21 so as to charge the battery 24.

The rectifier 22 is connected to the power receiving coil 21 to rectify AC power received by the power receiving coil 21 into DC power.

The relay 23 includes a relay switch that is turned on/off in accordance with the control by the charge controller 26. The relay 23 disconnects a main circuit system including the battery 24 from a circuit for charge including the power receiving coil 21 and the rectifier 22 once the relay switch is turned off.

The battery 24 is a power source of the vehicle 200 and configured such that a plurality of secondary batteries are connected to each other. The radio communication unit 25 communicates with the radio communication unit 13 installed in the wireless power supply device 100.

The charge controller 26 controls the charge of the battery 24, and controls the operations of the relay 23, the wireless communication unit 25, and the notifier 27. More particularly, the charge controller 26 transmits a signal for starting charging to the controller 14 through the communication between the radio communication units 25 and 13. The charge controller 26 is connected to a controller (not shown) for controlling the entire vehicle 200 via a controller area network (CAN). This controller manages a switching control of the inverter 28 and a state of charge (SOC) of the battery 24. When the charge controller 26 receives, from this controller, a signal indicating that the battery 24 is fully charged, the charge controller 26 transmits a signal for stopping charging to the controller 14.

The notifier 27 is, for example, a warning light or speaker, and outputs light or voice toward the driver in accordance with the control by the charge controller 26.

The inverter 28 is a power conversion circuit including a PWM control circuit having a switching device such as an IGBT. The inverter 28 converts DC power output from the battery 24 into AC power and supplies the converted power to the motor 29 according to a switching control signal. The motor 29 is, for example, a three-phase AC motor serving as a drive power source for driving the vehicle 200.

The front camera 30 (imaging means) images the circumference in front of the vehicle 200. The rear camera 31 (imaging means) images the circumference behind the vehicle 200. These cameras each include an image sensor such as CCD and CMOS for consecutively capturing images and outputting the captured images.

The operation processor 32 (controlling means) serves as an integrated computer including a CPU and a storage medium such as a RAM, a ROM, or a hard disk. The operation processor 32 can load images captured by the front camera 30 and the rear camera 31 to subject the images to predetermined image processing, and implement image control to switch pieces of information displayed on the display unit 33.

The display unit 33 (displaying means) is a display of, for example, a navigation system to inform the driver of various kinds of information. The display unit 33 can also display images captured by the front camera 30 and the rear camera 31.

Figure 2A:
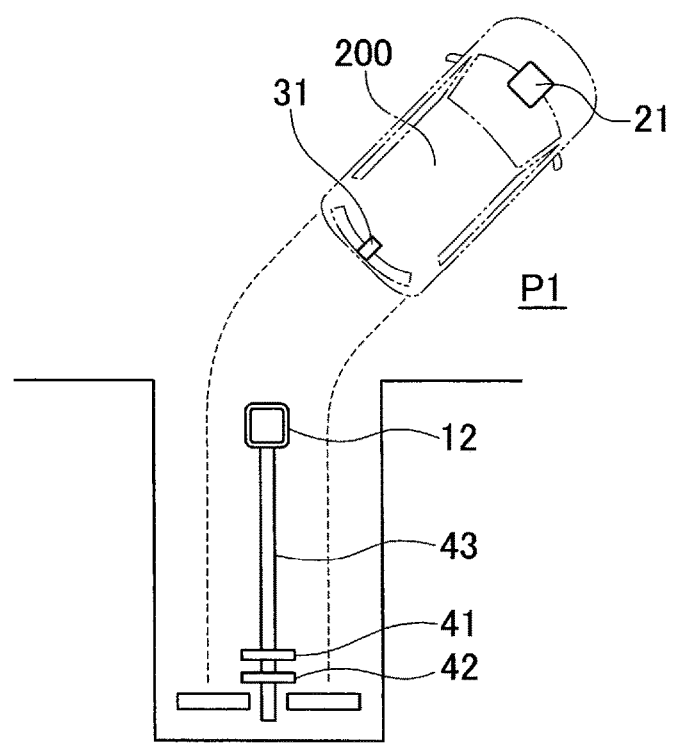
FIG. 2(a) is a top view showing a positional relationship between the vehicle provided with a power receiving coil and a parking space provided with a power transmission coil.
Figure 8A:
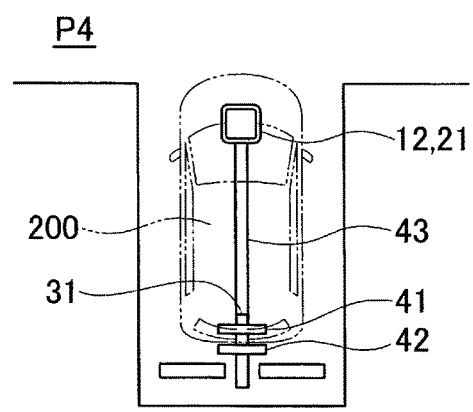
FIG. 8(a) is a top view showing a positional relationship between the vehicle provided with the power receiving coil and the parking space provided with the power transmission coil.

Next, the first step of assisting in positioning the power transmission coil 12 and the power receiving coil 21 is described below with reference to FIG. 2 to FIG. 4. The present embodiment exemplifies the case in which the vehicle 200 is parked in target parking position P4 while being reversed in a parking space equipped with the power transmission coil 12, as shown in FIG. 2(a). In order to efficiently implement power supply after parking in such a situation, the vehicle is required to be parked with the power transmission coil 12 and the power receiving coil 21 positioned accurately. The target parking position P4 is a position shown in FIG. 8(a) described below.

Figure 2B:
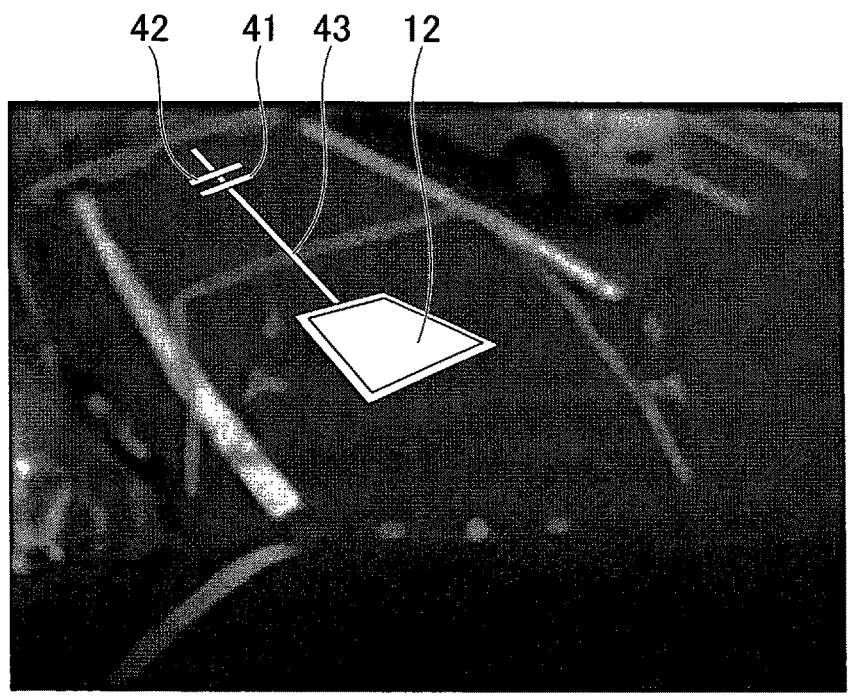
FIG. 2(b) is a rear camera image at reverse start position P1 shown in FIG. 2(a)
Figure 3:
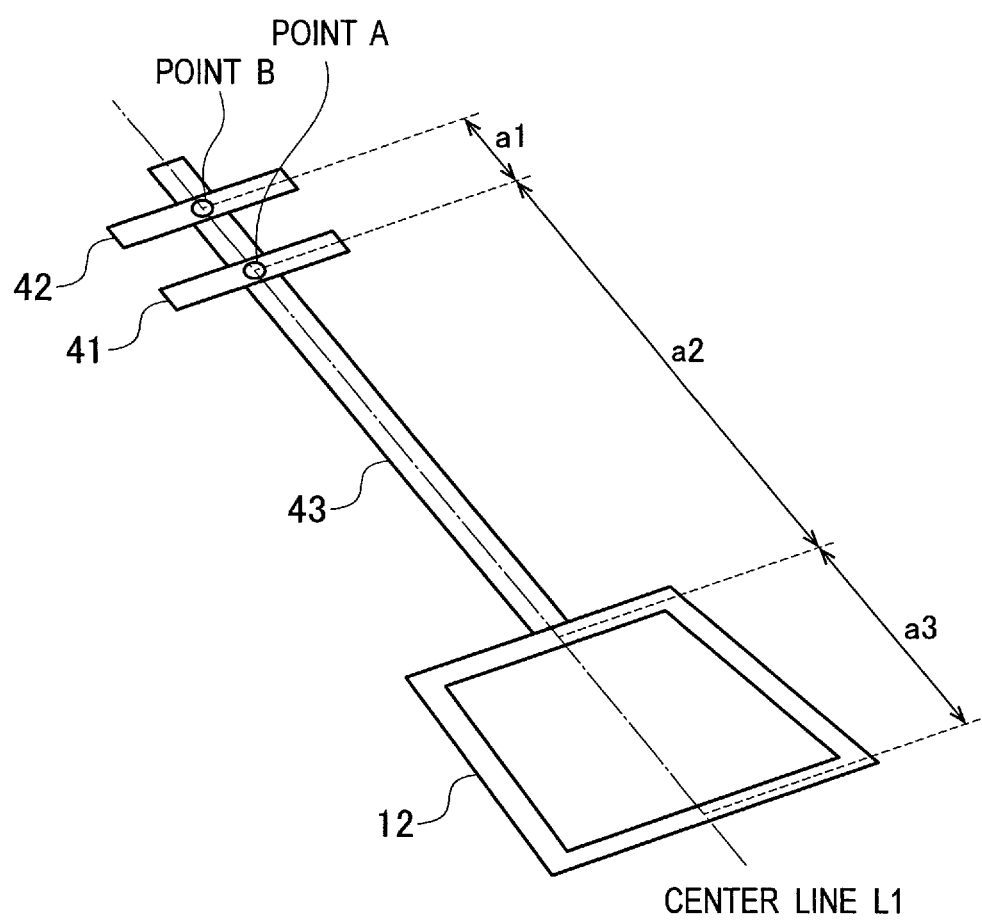
FIG. 3 is a schematic view showing a positional relationship between the power transmission coil and ground marks.

FIG. 2(b) is an image of the rear camera 31 of the vehicle 200 located in reverse start position P1 shown in FIG. 2(a). This image is displayed on the display unit 33 shown in FIG. 1. As shown in FIG. 2(b), the power transmission coil 12, ground marks 41, 42, and a power transmission cable 43 are indicated in the image of the rear camera 31. FIG. 2(b) is a video image of the rear camera 31 and also an image captured by the rear camera 31.

The ground marks 41 and 42 are provided on the road surface in the parking space equipped with the power transmission coil 12. The power transmission cable 43 is used for supplying electric power to the power transmission coil 12 and provided on the road surface in the parking space equipped with the power transmission coil 12. The power transmission cable 43 is covered for safety.

In the first step of assisting in positioning the power transmission coil 12 and the power receiving coil 21, the operation processor 32 shown in FIG. 1 calculates a distance between the power transmission coil 12 and the ground mark 41 and a distance between the respective ground marks 41 and 42 with reference to the image imaged by the rear camera 31 in which the power transmission coil 12 and the ground marks 41 and 42 are indicated together, as shown in FIG. 2(b). The image in which the power transmission coil 12 and the ground marks 41 and 42 are indicated together is hereinafter referred to as "a parking initial image".

The positional relationship among the power transmission coil 12, the ground marks 41, 42, and the power transmission cable 43 is described in detail below with reference to FIG. 3. FIG. 3 is a schematic view showing the positional relationship among the power transmission coil 12, the ground marks 41, 42, and the power transmission cable 43 shown in FIG. 2(b) imaged by the rear camera 31.

Point A is the center of the ground mark 41, and point B is the center of the ground mark 42. The power transmission cable 43 is located on the extension of the straight line connecting the points A and B. Center line L1 of the power transmission cable 43 passes through the middle of the power transmission coil 12.

Distance a1 is a distance between the respective ground marks 41 and 42. Distance a2 is a distance between the ground mark 41 and the power transmission coil 12. Distance a3 is a length of the power transmission coil 12 in the vehicle front-rear direction.

When the parking initial image is imaged by the rear camera 31, the operation processor 32 subjects the imaged parking initial image to predetermined image processing, so as to calculate the distances a1, a2, and a3.

The ground mark in the present embodiment has a square shape but may have any shape as long as the distance between the power transmission coil 12 and the ground mark can be calculated. The number of the ground marks used in the present embodiment is two but is not limited thereto. For example, a single large ground mark may be used so that a length between the upper end and the lower end of the ground mark is substituted for the distance a1.

Figure 4A:
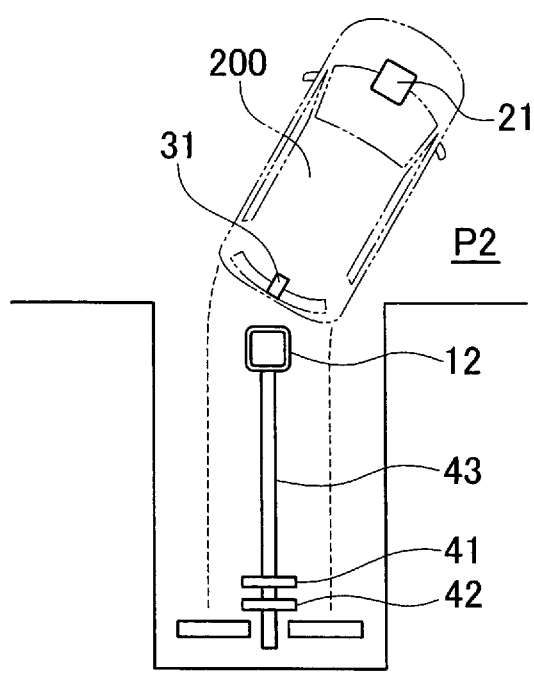
FIG. 4(a) is a top view showing a positional relationship between the vehicle provided with the power receiving coil and the parking space provided with the power transmission coil.
Figure 4B:
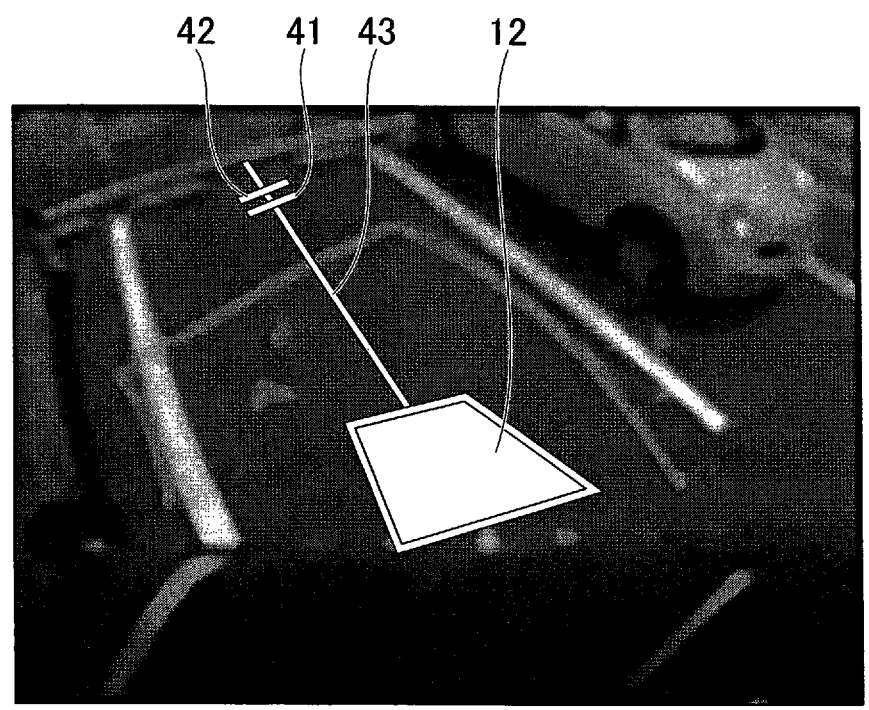
FIG. 4(b) is a rear camera image at position P2 shown in FIG. 4(a)

An operation of updating the parking initial image is described below with reference to FIG. 4. FIG. 4(a) is a top view showing a positional relationship between the vehicle 200 and the parking space equipped with the power transmission coil 12 when the vehicle 200 reaches position P2 after starting reversing at the reverse start position P1 shown in FIG. 2(a). FIG. 4(b) is an image of the rear camera 31 of the vehicle 200 located at the position P2 shown in FIG. 4(a).

When the vehicle 200 moves to the position P2 shown in FIG. 4(a) from the reverse start position P1 shown in FIG. 2(a), the rear camera 31 captures the power transmission coil 12 and the ground marks 41 and 42 together. When the image captured by the rear camera 31 is the parking initial image, the operation processor 32 overwrites and updates the image every time the parking initial image is imaged. The operation processor 32 subjects the updated parking initial image to predetermined image processing and calculates the distances a1, a2, and a3 shown in FIG. 3. The reason for updating the parking initial image is that the distances a1, a2, and a3 can be calculated more accurately as the distance from the rear camera 31 to the power transmission coil 12 and the ground marks 41 and 42 are closer.

Next, the second step of assisting in positioning the power transmission coil 12 and the power receiving coil 21 is described below with reference to FIG. 5 to FIG. 8.

Figure 5A:
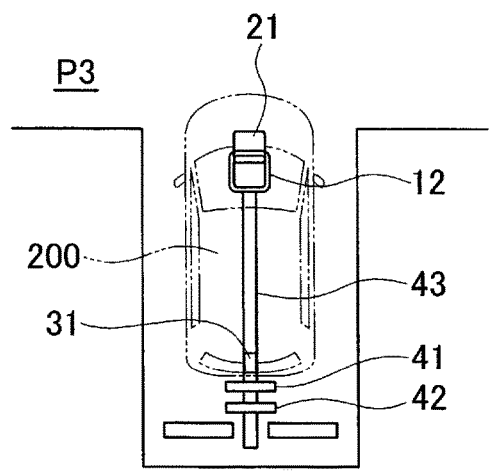
FIG. 5(a) is a top view showing a positional relationship between the vehicle provided with the power receiving coil and the parking space provided with the power transmission coil.
Figure 5B:
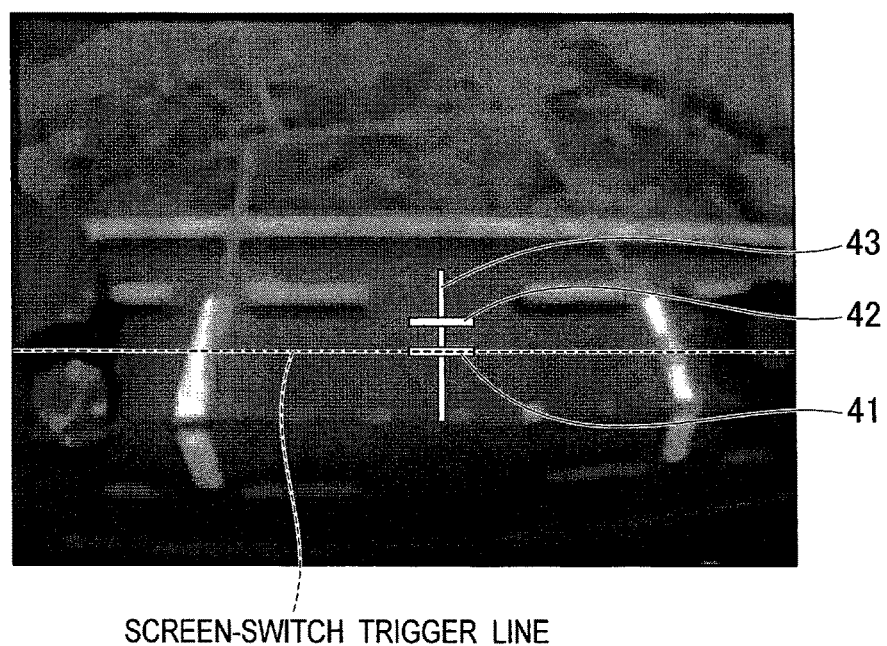
FIG. 5(b) is a rear camera image at position P3 shown in FIG. 5(a)

When the reversing vehicle 200 reaches position P3 shown in FIG. 5(a), the power transmission coil 12 is present below the vehicle 200. FIG. 5(b) is an image of the rear camera 31 of the vehicle 200 located at the position P3 shown in FIG. 5(a). Since the power transmission coil 12 is located below the vehicle 200, the power transmission coil 12 is not shown in the rear camera 31.

The dotted line shown in FIG. 5(b) is a screen-switch trigger line. The screen-switch trigger line is used for switching images displayed on the display unit 33. In particular, the screen-switch trigger line is set to reach the ground mark 41 when the distance between the vehicle 200 and the target parking position P4 falls below a predetermined value. The operation processor 32 switches screens shown on the display unit 33 when the screen-switch trigger line reaches the ground mark 41, as shown in FIG. 5(b). The setting of the screen-switch trigger line may vary as appropriate depending on the size of the vehicle 200, the position of the power receiving coil 21 installed in the vehicle 200, and the position of the power transmission coil 12 installed in the parking space. The screen-switch trigger line is a line not indicated on the display unit 33.

Next, an operation of switching screens displayed on the display unit 33 is described below with reference to FIG. 6. FIG. 6(a) is a screen having not yet been switched, displayed on the display unit 33, and is the same as FIG. 5(b). FIG. 6(b) is a switched screen displayed on the display unit 33. When the screen-switch trigger line shown in FIG. 5(b) reaches the ground mark 41, the operation processor 32 moves region R1 shown in FIG. 6(a) to the upper side of the screen so as to increase the display area of region R2. The operation processor 32 displays the power transmission coil 12 on the screen after switched.

Figure 7:
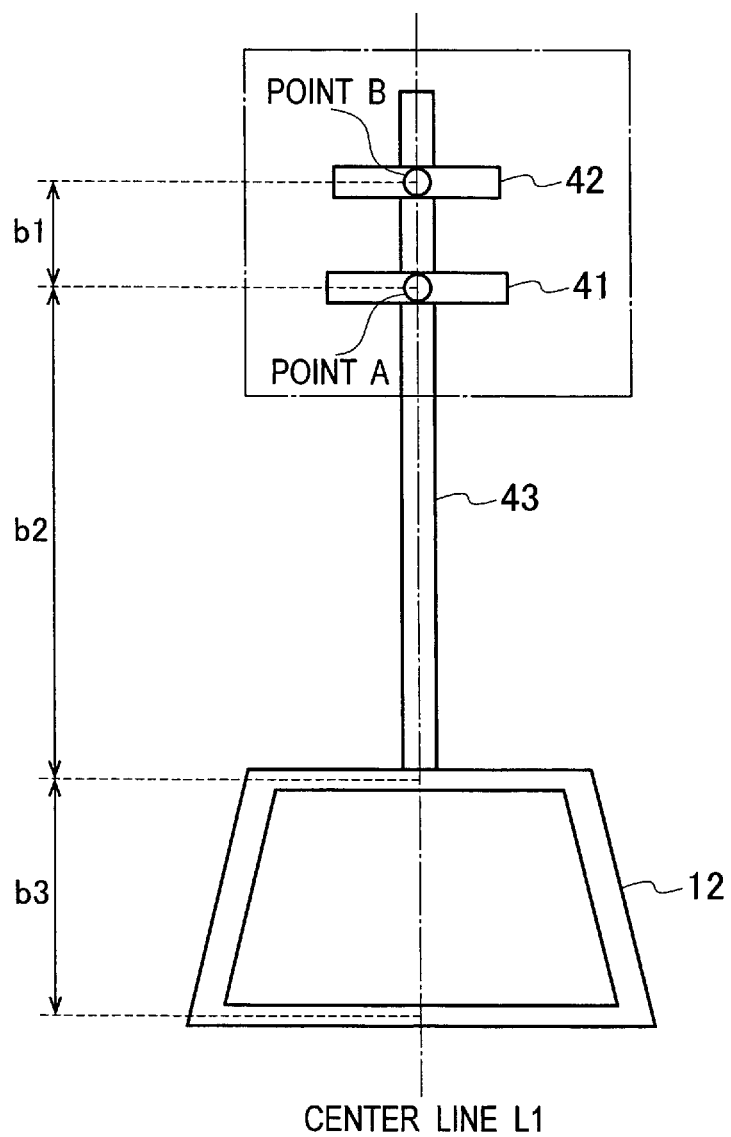
FIG. 7 is a schematic view showing a positional relationship between the power transmission coil and the ground marks.

A method of displaying the power transmission coil 12 on the switched screen is described below with reference to FIG. 7. FIG. 7 is a schematic view showing a positional relationship among the ground marks 41 and 42 displayed on the screen before switched as shown in FIG. 6(a), the power transmission coil 12, and the power transmission cable 43 estimated with reference to the ground marks 41 and 42 and the parking initial image. The area surrounded by the dashed-dotted line shown in FIG. 7 is a part shown in the rear camera 31 before screen switching, and the other areas are estimated parts.

The ground mark 41 and the ground mark 42 are indicated together in the image of the rear camera 31 imaged immediately before screen switching, as shown in FIG. 6(a) (imaged when the screen-switch trigger line reaches the ground mark 41, as shown in FIG. 5(b)). The image in which the ground marks 41 and 42 are indicated together when the screen-switch trigger line reaches the ground mark 41, is hereinafter referred to as "a parking final image". The operation processor 32 subjects the parking final image to predetermined image processing so as to calculate distance b1 between the respective ground marks 41 and 42. A ratio of the calculated distance b1 and the distance a1 shown in FIG. 3 can therefore be obtained. The ratio thus obtained, and the distances a2 and s3 in the parking initial image shown in FIG. 3 lead to distance b2 between the ground mark 41 and the power transmission coil 12 and distance b3 across the power transmission coil 12 in the vehicle front-rear direction. The operation processor 32 can estimate the position of the power transmission coil 12 through this processing. Accordingly, the operation processor 32 can display the image of the power transmission coil 12 having substantially the actual shape on the switched screen shown in FIG. 6(b), based on the estimated position of the power transmission coil 12. This allows the driver to recognize the position of the power transmission coil 12 as if the vehicle 200 were transparent, although the power transmission coil 12 actually cannot be viewed through the rear camera 31.

As shown in FIG. 6(b), the operation processor 32 displays the power receiving coil 21 installed in the vehicle 200 while superposing the power receiving coil 21 on the switched screen. The power receiving coil 21 displayed is a symbol schematically showing its shape. The position of the power receiving coil 21 can preliminarily be obtained.

Figure 8B:
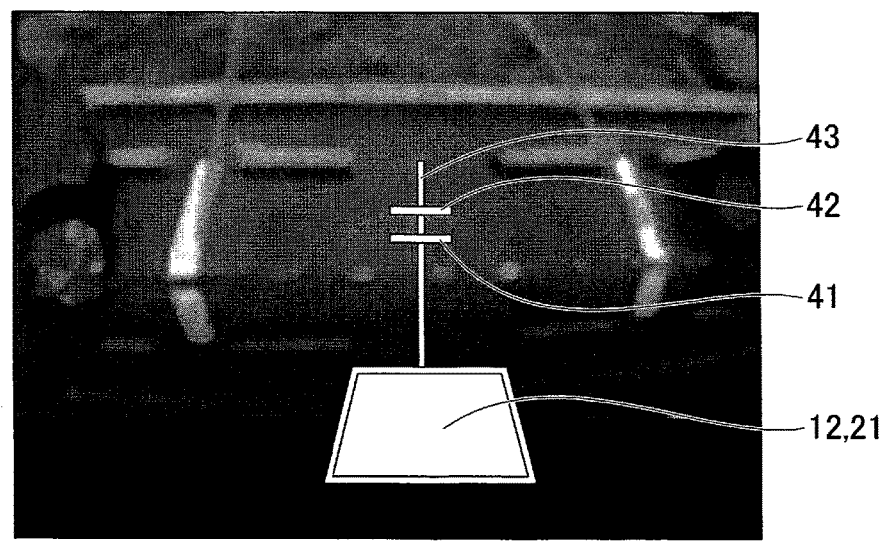
FIG. 8(b) is a screen of a display unit 33 displaying a state where the power transmission coil and the power receiving coil overlap each other at target parking position P4 shown in FIG. 8(a)

The positional relationship between the power transmission coil 12 and the power receiving coil 21 shown in FIG. 6(*b*) is the same as that shown in FIG. 5(*a*). The power transmission coil 12 and the power receiving coil 21 partly overlap each other, as shown in FIG. 5(*a*), and the driver can therefore immediately visually recognize the overlapping state, as shown in FIG. 6(*b*). In the present embodiment, when the vehicle 200 is reversing and moving to the target parking position P4, as shown in FIG. 8(*a*), the switched screen only indicates the movement of the power receiving coil 21. This means that the background and the power transmission coil 12 on the switched screen are not changed, but only the power receiving coil 21 is shifted. FIG. 8(*b*) is a screen of the display unit 33 showing the power transmission coil 12 and the power receiving coil 21 overlapping each other at the target parking position P4 shown in FIG. 8(*a*). The comparison between FIG. 6(*b*) and FIG. 8(*b*) shows that only the power receiving coil 21 is shifted. Since only the movement of the power receiving coil 21 is indicated on the switched screen, the driver can focus only on the power receiving coil 21 moving in association with the vehicle 200, so as to position the power transmission coil 12 and the power receiving coil 21 with high accuracy.

In the second step of assisting in positioning the power transmission coil 12 and the power receiving coil 21, as described above, the operation processor 32 switches the screens displayed on the display unit 33. The operation processor 32 then displays the image of the power transmission coil 12 having substantially the actual shape on the switched screen, and superposes and displays the symbol schematically showing the power receiving coil 21 on the screen. The operation processor 32 moves only the power receiving coil 21 in association with the movement of the vehicle 200. The parking assistance device according to the present embodiment assists in positioning the power transmission coil 12 and the power receiving coil 21 through the process as described above.

Figure 9A:
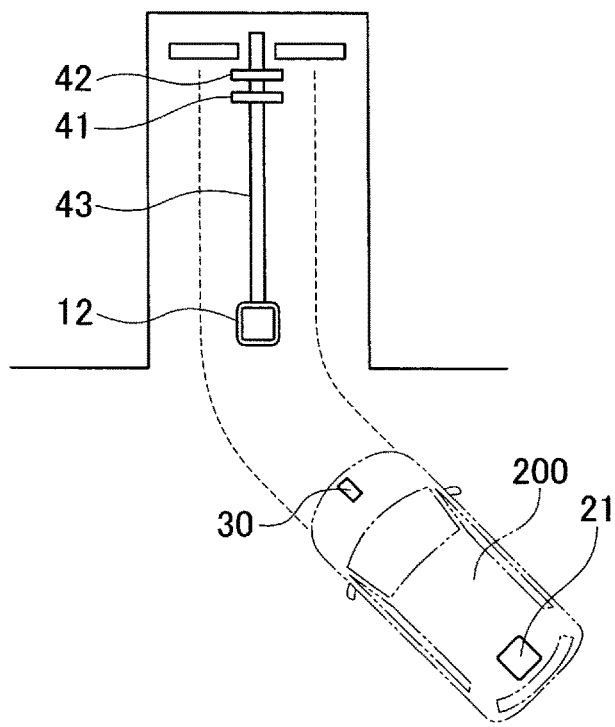
FIGS. 9(a) and 9(b) are top views each showing a positional relationship between the vehicle provided with the power receiving coil and the parking space provided with the power transmission coil.
Figure 9B:
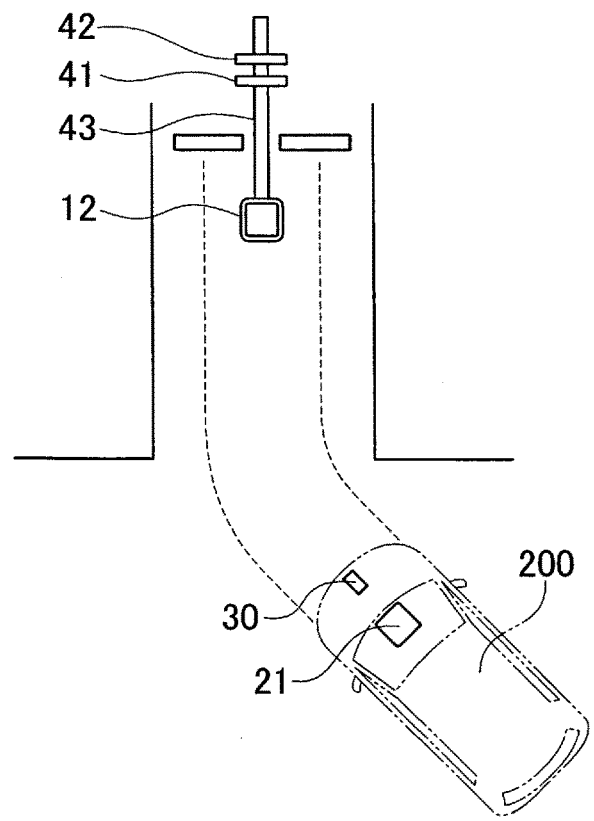

The present embodiment has exemplified the case of assisting in positioning the power transmission coil 12 and the power receiving coil 21 during reverse parking, but may be applied to the case of forward parking or parallel parking. For example, during forward parking, as shown in FIG. 9(*a*), the assistance in positioning may be implemented by use of images of the front camera 30 in the same manner as the present embodiment described above. The assistance in positioning may also be implemented when the power transmission coil 12, the power receiving coil 21, and the ground marks 41 and 42 differ from those in the present embodiment, as shown in FIG. 9(*b*).

Figure 10:
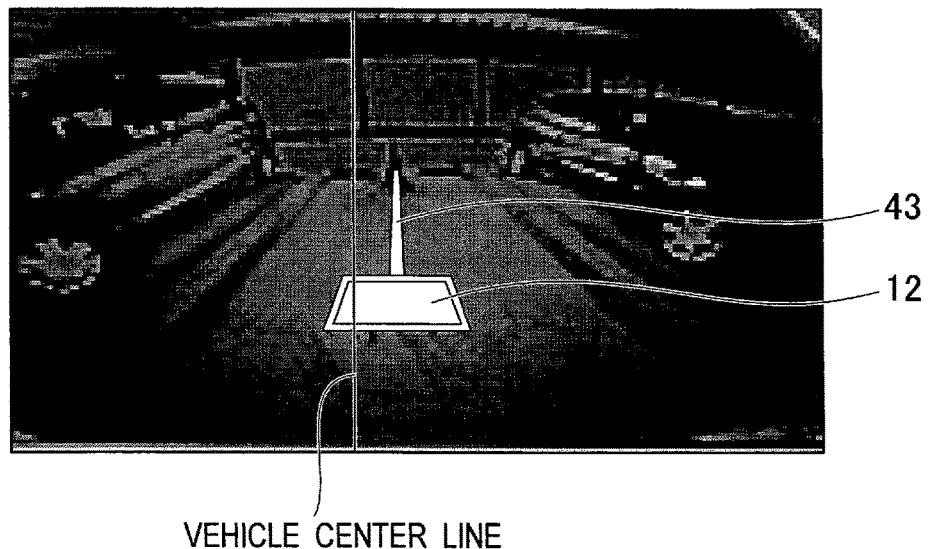
FIG. 10 is a view in which a vehicle center line is superposed on a camera image displayed on the display unit 33.

Alternatively, in the present embodiment, a vehicle center line to the vehicle width direction may be displayed on the display unit 33, as shown in FIG. 10. When the center line of the power receiving coil 21 to the vehicle width direction coincides with the vehicle center line, the driver can park the vehicle 200 such that the vehicle center line conforms to the center of the power transmission coil 12, which facilitate the positioning between the power transmission coil 12 and the power receiving coil 21. When the center line of the power receiving coil 21 to the vehicle width direction does not coincide with the vehicle center line, the coil center line may be displayed on the display unit 33, instead of the vehicle center line. The vehicle center line displayed may be indicated at the point when the screens are switched, for example.

In the present embodiment, an image denoting a body frame of the vehicle 200 may be superposed on the switched screen. This allows the driver to easily position the power transmission coil 12 and the power receiving coil 21 with higher accuracy while viewing the power transmission coil 12, the power receiving coil 21, and the body frame.

In the present embodiment, a level of superposition of the power transmission coil 12 and the power receiving coil 21 may be indicated on the switched screen by use of weak excitation so as to inform the driver of the information in terms of percentage from 0% to 100%.

In the present embodiment, when a proximity sensor detects an obstacle reaching the vehicle 200 during driving after switching the screens, the screen switched may be returned to the original one. Although the driver cannot recognize the condition behind the vehicle from the switched screen on the display unit 33 since the background image on the switched screen does not change, returning to the original screen can make the driver aware of the detection of the obstacle.

In the present embodiment, since the screens are switched when the screen-switch trigger line reaches the ground mark 41, the driver can concentrate on parking until the screens are switched. In other words, holding off switching the screens can prevent the driver from keeping focusing on the coil positioning, so as to reduce the risk of a collision with an obstacle.

Figure 11:
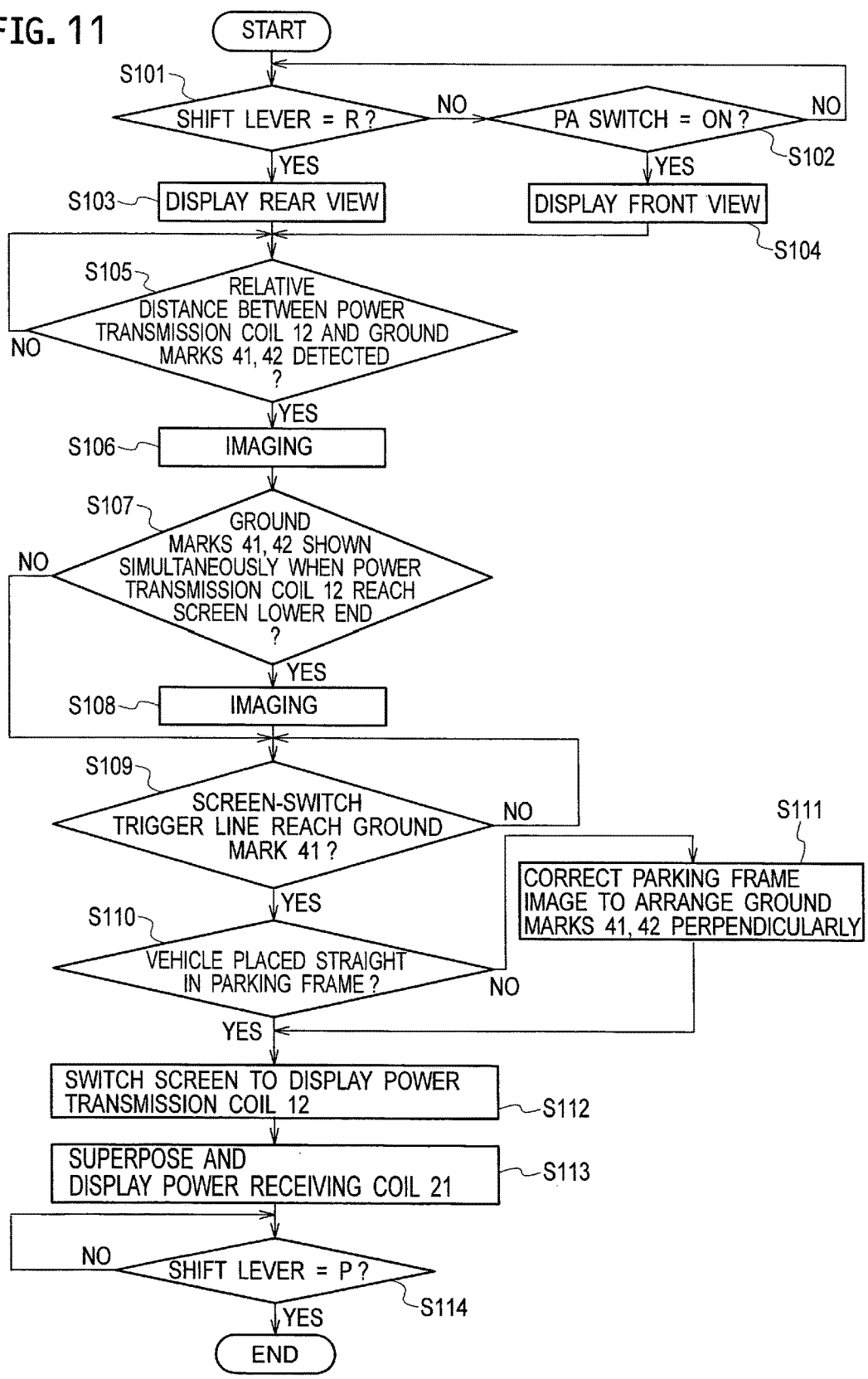
FIG. 11 is a flowchart for describing a parking assistance operation executed by an operation processor according to the embodiment.

Next, the display processing performed on the display unit 33 by the operation processor 32 is described below with reference to the flowchart showing in FIG. 11. This processing starts once an ignition switch is turned on.

In step S101, the operation processor 32 determines whether a shift lever is located in R (reverse gear position). When the shift lever is located in the reverse gear position, the process proceeds to step S103. When the shift lever is not located in the reverse gear position, the process proceeds to step S102. In step S102, the operation processor 32 determines whether a parking assist (PA) switch is in the ON state. The PA switch is a switch for displaying an image of the front camera 30 on the display unit 33. The PA switch may be either a hard switch provided in the passenger compartment or a soft switch indicated on the display unit 33. When the PA switch is in the ON state, the process proceeds to step S104. When the PA switch is in the OFF state, the process is in a standby mode.

In step S103, the operation processor 32 displays the image of the rear camera 31 (rear view) on the display unit 33.

In step S104, the operation processor 32 displays the image of the front camera 30 (front view) on the display unit 33.

In step S105, the operation processor 32 determines whether relative distances between the power transmission coil 12 and the ground mark 41 and between the ground mark 41 and the ground mark 42 can be detected. When the relative distances between the power transmission coil 12 and the ground mark 41 and between the ground mark 41 and the ground mark 42 can be detected, namely, when the power transmission coil 12 and the respective ground marks 41 and 42 are shown simultaneously in the rear camera 31 or the front camera 30, the process proceeds to step S106. When the relative distances between the power transmission coil 12 and the ground mark 41 and between the ground mark 41 and the ground mark 42 cannot be detected, the process returns to step S105.

In step S106, the operation processor 32 images the power transmission coil 12 and the respective ground marks 41 and 42 by use of the front camera 30 or the rear camera 31. The image obtained is the parking initial image.

In step S107, the operation processor 32 then determines whether the respective ground marks 41 and 42 are shown together on the screen when the power transmission coil 12 reaches the lower end of the screen of the front camera 30 or the rear camera 31. When the respective ground marks 41 and 42 are shown together on the screen when the power transmission coil 12 reaches the lower end of the screen of the front camera 30 or the rear camera 31, the process proceeds to step S108. When the respective ground marks 41 and 42 are not shown together when the power transmission coil 12 reaches the lower end of the screen of the front camera 30 or the rear camera 31, the process proceeds to step S109.

In step S108, the operation processor 32 images the power transmission coil 12 and the ground marks 41 and 42 by use of the front camera 30 or the rear camera 31, and overwrites and updates the parking initial image previously imaged.

In step S109, the operation processor 32 determines whether the ground mark 41 reaches the screen-switch trigger line. When the ground mark 41 reaches the screen-switch trigger line, the process proceeds to step S110. When the ground mark 41 does not yet reach the screen-switch trigger line, the process returns to step S109. The operation processor 32 captures the image in which the ground marks 41 and 42 are shown together by use of the front camera 30 or the rear camera 31 when the ground mark 41 reaches the screen-switch trigger line. The image captured is the parking final image.

In step S110, the operation processor 32 determines whether the vehicle 200 is placed straight in the parking frame. This determination is to confirm whether the ground marks 41 and 42 displayed on the display unit 33 are arranged perpendicularly to the display unit 33. When the vehicle 200 is placed straight in the parking frame, the process proceeds to step S112. When the vehicle 200 is not placed straight in the parking frame, the process proceeds to step S111.

In step S111, the operation processor 32 corrects the parking frame image so that the ground marks 41 and 42 are arranged perpendicularly to the parking frame image. This correction can inform the driver of the inclination of the vehicle 200 with respect to the parking frame.

In step S112, the operation processor 32 switches the screens to display the image of the power transmission coil 12 having substantially the actual shape on the switched screen with reference to the parking initial image and the parking final image.

In step S113, the operation processor 32 superposes and displays, on the switched screen, a symbol of the power receiving coil 21 schematically showing the shape of the power receiving coil 21 installed in the vehicle 200.

In step S114, the operation processor 32 determines whether the shift lever is located in P (parking gear position). When the shift lever is located in the parking gear position, the process completes the series of steps. When the shift lever is not located in the parking gear position, the process returns to step S114.

As described above, the parking assistance device according to the present embodiment switches the screens of the display unit 33 when the power transmission coil 12 disappears from the rear camera 31 or the front camera 30. Subsequently, the parking assistance device estimates the position of the power transmission coil 12 according to the parking initial image and the parking final image, and displays the image of the power transmission coil 12 having substantially the actual shape on the display unit 33. The parking assistance device then superposes and displays, on the switched screen, a symbol of the power receiving coil 21 schematically showing the shape of the power receiving coil 21 installed in the vehicle 200. The parking assistance device only indicates the movement of the power receiving coil 21 on the switched screen. Accordingly, the driver can immediately figure out the positional relationship between the power transmission coil 12 and the power receiving coil 21, so as to implement the positioning therebetween with high accuracy.

The parking assistance device according to the present embodiment also displays the vehicle center line to the vehicle width direction on the display unit 33. The driver can therefore park the vehicle such that the vehicle center line conforms to the center of the power transmission coil 12, which facilitates the positioning between the power transmission coil 12 and the power receiving coil 21.

While the present invention has been described above by reference to the embodiment, the present invention is not intended to be limited to the descriptions thereof, and various modifications and improvements will be apparent to those skilled in the art.

REFERENCE SIGNS LIST

12 POWER TRANSMISSION COIL
21 POWER RECEIVING COIL (COIL FOR VEHICLE)
30, 31 CAMERA (IMAGING MEANS)
32 OPERATION PROCESSOR (CONTROLLING MEANS)
33 DISPLAY UNIT (DISPLAYING MEANS)
41, 42 GROUND MARK

The invention claimed is:

1. A parking assistance device comprising:
an image sensor mounted on a vehicle to image a periphery of the vehicle;
a coil for a vehicle installed on a bottom surface of the vehicle;
a display configured to display an image imaged by the image sensor; and
a control circuit configured to perform a display control on the display,
wherein the control circuit stores a parking initial image imaged by the image sensor and simultaneously showing a power transmission coil installed on a road surface in a parking space and a ground mark provided at a predetermined distance from the power transmission coil, and estimates a position of the power transmission coil according to a parking final image indicating the ground mark imaged by the image sensor and the parking initial image when a distance between the vehicle and a target parking position falls below a predetermined value and the power transmission coil disappears from the image sensor, and displays an image showing the power transmission coil on the display according to the estimated position of the power transmission coil, and superposes and displays an image indicating the coil for a vehicle on the display.

2. The parking assistance device according to claim 1, wherein the control circuit superposes and displays, on the display, a center line of the coil for a vehicle to a vehicle width direction.

3. A parking assistance method comprising:
imaging a parking initial image simultaneously showing a power transmission coil installed on a road surface in a parking space and a ground mark provided at a predetermined distance from the power transmission coil;

estimating a position of the power transmission coil according to a parking final image indicating the ground mark imaged and the parking initial image when a distance between a vehicle and a target parking position falls below a predetermined value and the power transmission coil disappears from an image sensor;

displaying an image indicating the power transmission coil according to the estimated position of the power transmission coil;

superposing and displaying an image indicating a coil for a vehicle installed on a bottom surface of the vehicle.

* * * * *